United States Patent
Fournel (12) 
(10) Patent No.: US 6,563,372 B1
(45) Date of Patent: *May 13, 2003

(54) DEVICE FOR THE CONTROL OF A TRANSLATOR-TYPE HIGH VOLTAGE SELECTOR SWITCH

(75) Inventor: Richard Fournel, Lumbin (FR)

(73) Assignee: STMicroelectronics SA, Gentilly (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/616,758

(22) Filed: Jul. 14, 2000

(30) Foreign Application Priority Data

Jul. 30, 1999 (FR) .............................. 99 09969

(51) Int. Cl.$^7$ .............................. G05F 1/10
(52) U.S. Cl. .................. 327/543; 327/541; 327/333
(58) Field of Search .................. 327/530, 538, 327/540, 541, 543, 108, 309, 310, 313, 314, 320, 321, 52, 57, 333; 365/226, 185.18, 189.11, 189.09, 185.23; 373/312, 313, 314, 315; 326/30, 81, 86, 68

(56) References Cited

U.S. PATENT DOCUMENTS

| | | | | |
|---|---|---|---|---|
| 5,369,354 A | * | 11/1994 | Mori ...................... | 323/314 |
| 5,444,664 A | * | 8/1995 | Kuroda et al. .............. | 365/326 |
| 5,528,130 A | * | 6/1996 | Okamura ................... | 323/314 |
| 5,546,042 A | * | 8/1996 | Tedrow et al. .............. | 327/538 |
| 5,587,960 A | * | 12/1996 | Ferris ..................... | 365/230.03 |
| 5,736,876 A | * | 4/1998 | Fournel .................... | 327/530 |
| 6,181,606 B1 | * | 1/2001 | Choi et al. ................ | 365/185.23 |
| 6,366,505 B1 | * | 4/2002 | Fournel .................... | 365/189.09 |

FOREIGN PATENT DOCUMENTS

| | | |
|---|---|---|
| EP | 0 774 838 | 5/1997 |
| GB | 2 201 059 | 8/1998 |

* cited by examiner

*Primary Examiner*—Terry D. Cunningham
*Assistant Examiner*—Long Nguyen
(74) *Attorney, Agent, or Firm*—Allen, Dyer, Doppelt, Milbrath & Gilchrist, P.A.; Lisa K. Jorgenson (57) ABSTRACT

A control device is for a selector switch of a type receiving a high inout voltage $E_{HV}$ and including at least one cascoded stage having MOS transistors. The control device includes a circuit for generating at least one reference voltage from the high input voltage to bias the MOS transistors of the cascoded stage. The circuit includes three MOS transistors series-connected between the high input voltage and ground. The at least one reference voltage is provided at the drain or the source of the middle MOS transistor. The control device also includes a control circuit to control the gate of the middle MOS transistor as a function of the level of the high input voltage. The control circuit includes a first resistor, a diode, and a second resistor connected in series. A gate control voltage is provided at the connection between the diode and one of the resistors. The device may advantageously be used in the programming of non-volatile memory elements.

30 Claims, 4 Drawing Sheets

DEVICE FOR THE CONTROL OF A TRANSLATOR-TYPE HIGH VOLTAGE SELECTOR SWITCH

FIELD OF THE INVENTION

The present invention relates to electrical circuits and, more particularly, to a device for the control of a translator-type high voltage switch.

BACKGROUND OF THE INVENTION

Electrically programmable non-volatile memories found in integrated circuits are programmed using a voltage with a level higher than that of the logic supply voltage Vcc for the integrated circuit. The value of this high programming voltage depends upon the integrated circuit technology being used.

To apply the high programming voltage to an integrated circuit element (e.g., a row of memories), it is common practice to use a high voltage selector switch, also called a level translator. At its inputs, the selector switch receives a logic control signal and a high input voltage. Depending on the logic level (i.e., Vcc or zero) of the logic control signal (which, in the case of a memory, will come from a write control signal), either ground or the high input voltage level is provided at an output of the selector switch. These selector switches are well known to those skilled in the art.

In particular, CMOS selector switches typically have two arms, where each arm has two transistors connected in series between the high input voltage and ground. The bottom transistors are N type transistors and have their respective sources connected to ground. The bottom transistors are also called selector switch transistors because one receives the selection switching signal and the other receives the reverse selection switching signal. The selection switching signals are logic signals of zero or Vcc. The toP type transistors are P type transistors and have their sources connected to a node receiving the high input voltage. Each toP type transistor has its gate connected to the drain of the upper transistor of the other arm. The bottom transistors are also called load transistors.

Depending upon the levels of the selection switching signals, one selector switch N type transistor is always off and the selector switch N type transistor of the other arm will always be on. The N type transistor that is on draws its drain toward zero volts (the potential of its source), and the P type transistor of the other arm, which has its gate connected to this drain, turns on. The P type transistor therefore takes its own drain to the voltage of its source, that is, to the high input voltage level. Thus, at each connection node of the drains of the N and P type transistors of one arm, ground or the high input voltage level will be present.

These selector switches usually have an intermediate stage between the stage of the top transistors and the stage of the bottom transistors. The intermediate stage includes one or more cascoded stages and enables the internal nodes of the selector switch to be limited to intermediate voltage levels so that no transistor of the selector switch experiences any excessively high voltage at its terminals.

In certain circuits of the prior art, all the MOS transistors (N or P type) of the cascoded stage are biased at their gate by the logic supply voltage Vcc. This bias limits the range of operation of the selector switch. Indeed, the switching over of the selector switch to obtain the high input voltage level at its output can be done only when the level of the input is sufficiently high, which in practice is higher than the logic supply voltage Vcc.

A disadvantage of such circuits is that with thin oxide MOS technologies, the switching operations of the selector switch under high voltage may have harmful transient effects on the MOS transistors. Furthermore, with this kind of biasing of the gates of the cascoded transistors at the logic supply voltage, there is a voltage dependent on the high input voltage at the drains and sources of the cascoded transistors but no link therebetween. This may give rise to additional stresses if the difference between these two voltages becomes to great.

For these reasons, the gates of these cascoded transistors are preferably biased at a reference voltage obtained from the high input voltage. Thus, it is possible to control the voltage difference between the reference voltage and the other high input voltage since the former depends on the latter, thus providing for better protection. In the case of a cascoded stage with N and P type MOS transistors, the gates of the N type transistors of the cascoded stage are usually biased at a reference voltage $Vref_n$ that is higher than a reference voltage $Vref_p$ which biases the gate of the P type transistors of the cascoded stage. This makes it possible to bring down the lower switch-over limit of the selector switch.

Figure 1:
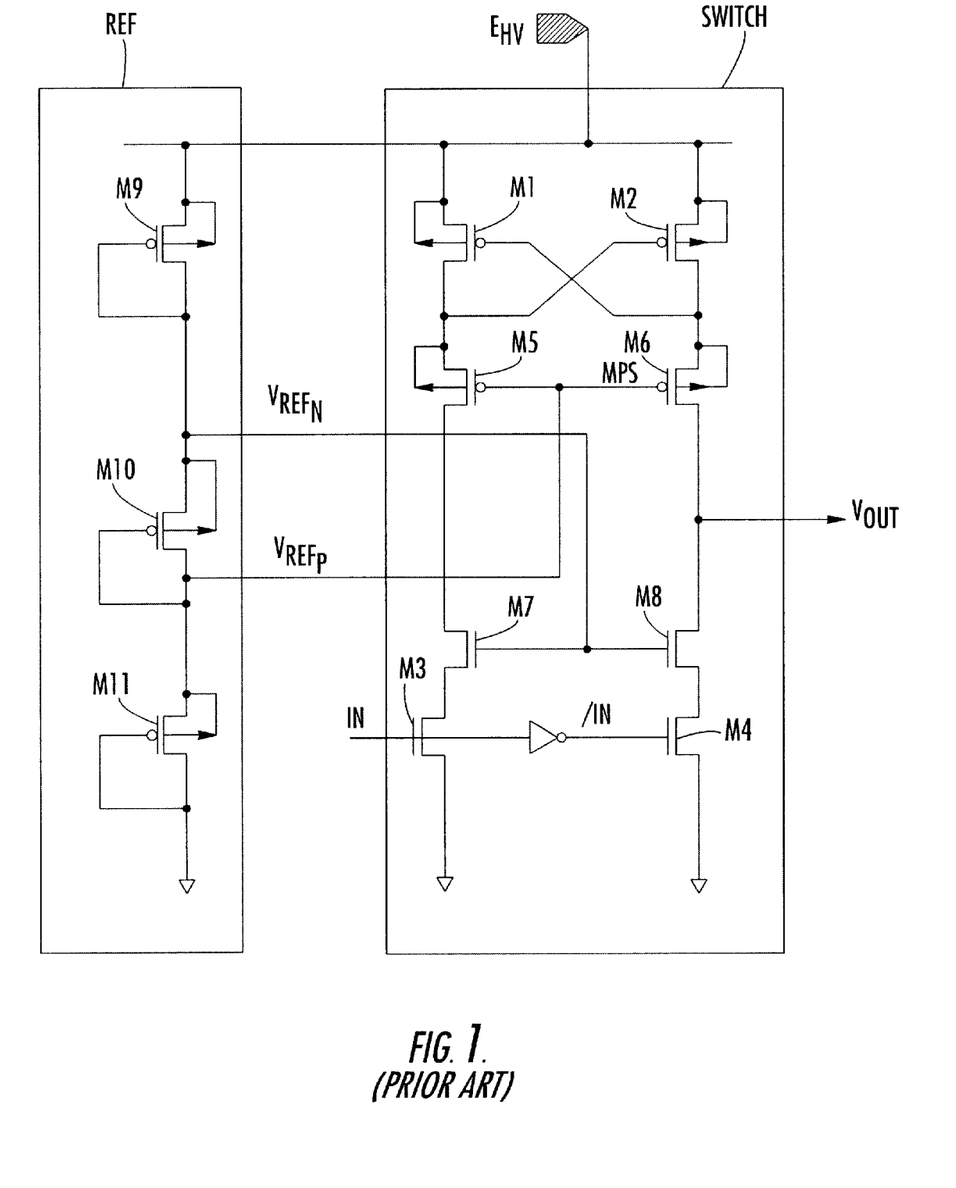
FIG. 1, which has already been described, is a schematic diagram of a high voltage selector switch with a cascoded stage and a circuit for the generation of reference voltages applied to the transistors of the cascoded stage according to the prior art.

An exemplary cascoded stage selector switch of this type is shown in FIG. 1. In this illustration, the upper stage comprises a P type MOS transistor M1 in the first arm and a P type MOS transistor M2 in the second arm. These transistors receive the high input voltage Ehv at their respective sources. The bottom stage comprises a N type MOS transistor M3 in the first arm and a N type MOS transistor M4 in the second arm. These transistors have their respective sources connected to the ground Gnd.

The cascoded stage comprises four MOS transistors, two P type MOS transistors M5 and M6, one in each arm and beneath each toP type transistor, and two N type MOS transistors M7 and M8, one in each arm and above each bottom transistor. The P type MOS transistors M5 and M6 receive the reference voltage $Vref_p$ at their respective gates. The N type MOS transistors M7 and M8 receive the reference voltage $Vref_n$ at their respective gates.

The output Vout of the selector switch is taken between the N and P type cascoded transistors of one arm, for example, at the drains of the transistors M6 and M8. The gate of the bottom transistor M3 of the first arm of the selector switch receives a selection switching logic signal reference IN, and the gate of the bottom transistor M4 of the second arm of the selector switch receives the reverse signal referenced/IN.

The circuit REF generates the reference voltages $Vref_n$ and $Vref_p$ and it includes three MOS transistors M9, M10 and M11 series-connected between the high voltage Vpp and ground. The transistors M9, M10 and M11 (illustratively shown as P type transistors) act as resistors because each has its gate connected to its drain. The reference voltages $Vref_n$ and $Vref_p$ are obtained by taking the voltage on either side of the med-point transistor M10.

The role of the cascoded stage is to limit the voltages experienced by the transistors to intermediate levels. Each P type cascoded transistor is biased so that it always remains on. Thus, the source of each of these transistors, and hence the drain of the P type load transistor with which it is connected, cannot go below $Vref_p - Vt_p$, where $Vt_p$ is the threshold voltage of the P Hype cascoded transistor. Similarly, each N type cascoded transistor is biased so that it always remains on. Thus, its source, and therefore the drain of the selector switch N type transistor with which At is connected, cannot rise above $Vref_n - Vt_n$, where $Vt_n$ is the threshold voltage of the N type cascaded transistor.

Figure 2:
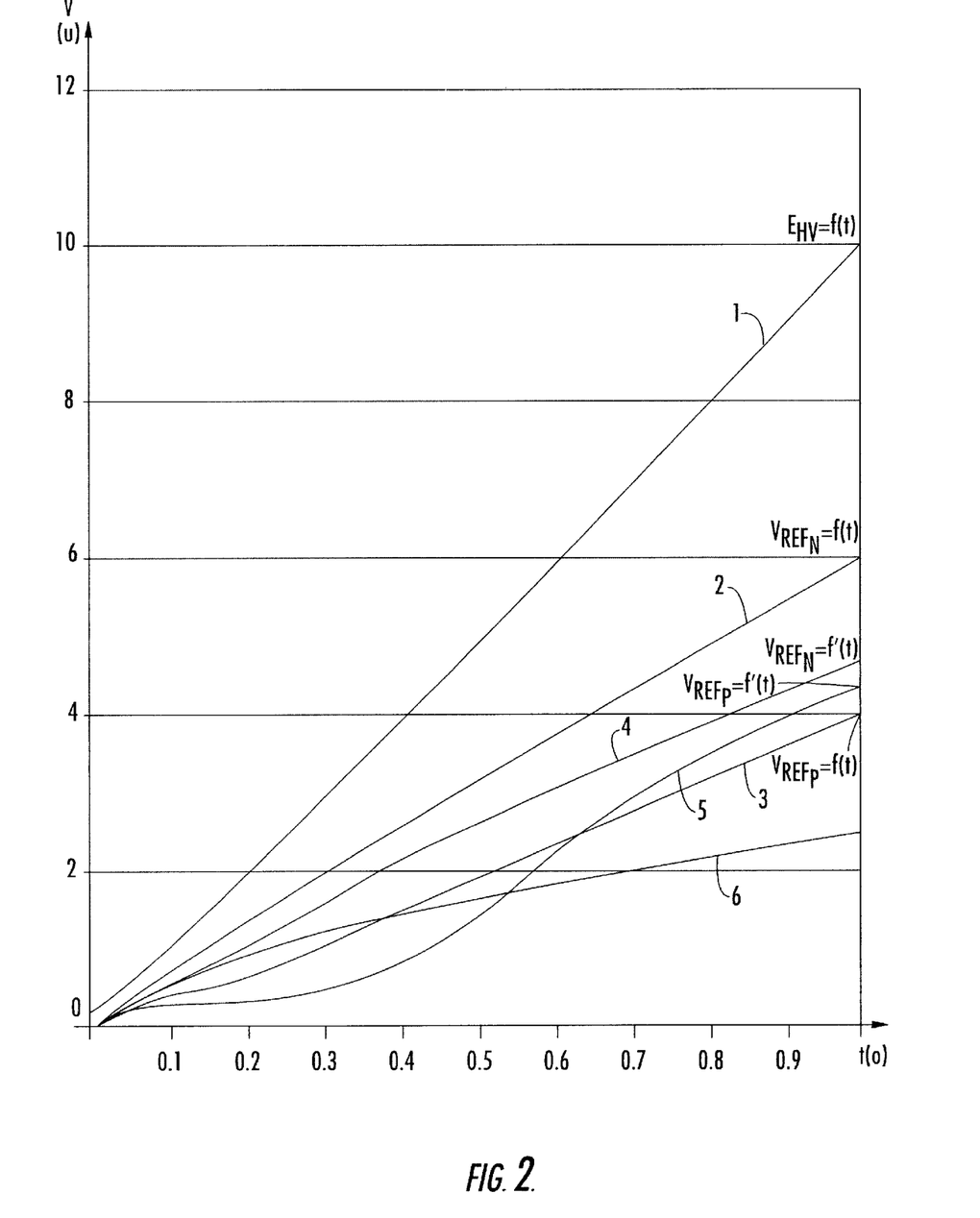
FIG. 2 is a graph showing the curves of growth of the reference voltages obtained according to the prior art and according to the invention.

Turning now to FIG. 2, an example is presented in which the high input voltage Ehv of the selector switch takes the form of a pulse with a voltage build-up ramp as shown in the curve 1. The high input voltage Ehv increases linearly from zero to its rated value Vpp (the slope of the increase may be linear, logarithmic, exponential, etc.). The two curves 2 and 3 respectively represent the progress of the reference voltages $Vref_n$, $Vref_p$.

The curves 2 and 3 show that the reference voltages $Vref_n$, $Vref_p$ follow the voltage build up of the high input voltage Ehv. They also show that the differences between each of these reference voltages and the level of the high input voltage Ehv at the beginning of the ramp (i.e., in the low voltage values of the input Ehv) do not allow the different transistors of the cascoded stage to be conductive. In these low values of the high input voltage, the selector switch therefore cannot switch over. By way of example, for a circuit supplied at Vcc=3.3 volts, the level of the high input voltage should be higher than 3.8 volts so that the selector switch can switch over.

Switching over at-high values of the input Ehv, namely values higher than Vcc, contributes to the production of hot electrons. Repeated selection switching commands greatly increase the quantity of these hot electrons. Ultimately, this causes damage to the transistors of the selector switch. For these reasons, the prior art selector switches can withstand only a limited number of selection switching operations.

SUMMARY OF THE INVENTION

It is an object of the invention to resolve the above technical problem. The present invention achieves the switching of the selector swatch at the low values of the high input voltage. Once the transistors have switched over, the level of the high input voltage can rise with reduced risk of damage to these transistors.

The present invention also provides for a switching over of the selector switch to the low values of the high input voltage. In the circuit for the generation of reference voltages, the middle transistor provides the two reference voltages at its terminal and has its date controlled by a control circuit, rather than its drain. The control circuit has two resistors and one diode arranged to increase the voltage difference with the high input voltage, in the low values of this high input voltage, and to limit the rise of the reference voltages in the high values. Thus, generating appropriate reference voltages, the switching of the selector swatch is permitted in the low values of the high input voltage while limiting the level of the reference voltages in the high value.

The invention therefore relates to a device for the control of a selector switch receiving a high input voltage including at least one cascoded stage having MOS transistors. The device includes a circuit for generating a reference voltage from the high input voltage to bias the MOS transistors of the cascoded stage. The reference voltage generation circuit provides a first reference voltage and a second reference voltage taken respectively at the drain and source of a MOS transistor.

The device also includes a circuit to control the gate of the MOS transistor based upon the high input voltage. The circuit includes a first resistor, a diode, and a second resistor connected in series. The point of connection between the diode and one of the resistors provides a gate control voltage capable of setting the transistor in a conductive state or a non-conductive state depending upon the level of the high input voltage.

BRIEF DESCRIPTION OF THE DRAWINGS

Other features and advantages of the invention are provided in the following description. The description is made with reference to the appended drawings, of which.

DETAILED DESCRIPTION OF THE PREFERRED EMBODIMENTS

Figure 3:
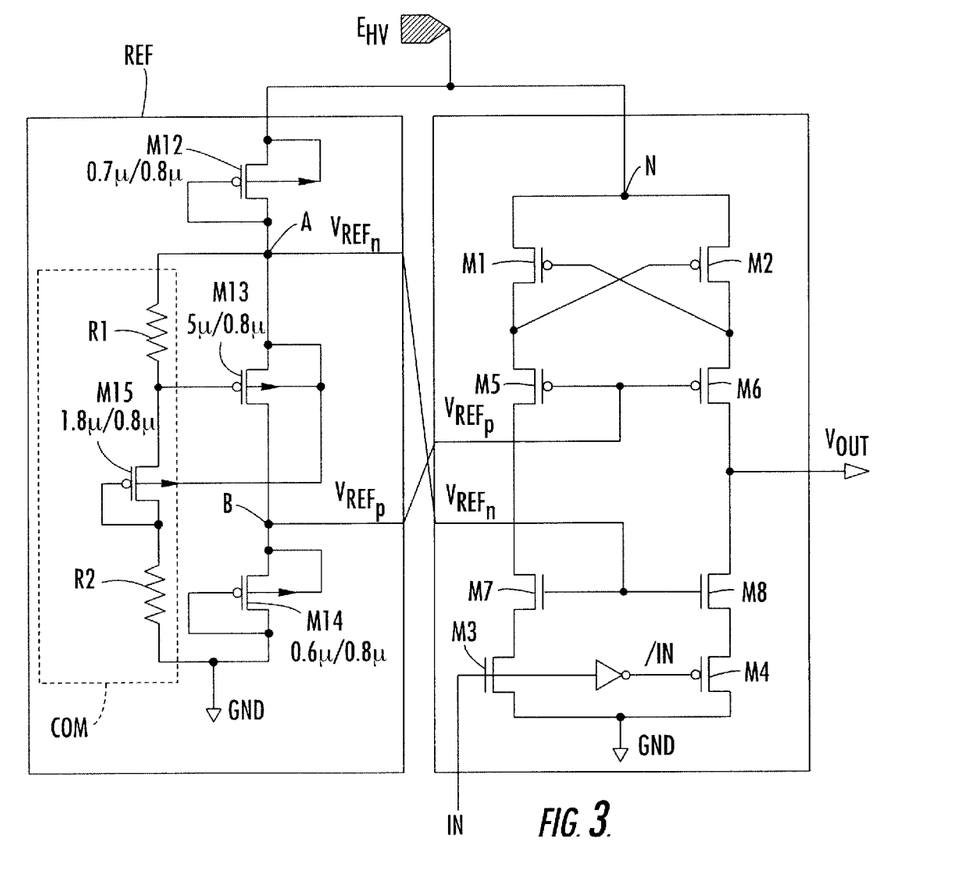
FIG. 3 is a schematic diagram showing the control circuit of the reference voltage generation circuit according to the invention.

Turning now to FIG. 3, a control device for a selector switch of a high input voltage Ehv according to the invention is now described. The selector switch comprises a cascoded stage. There can be several such cascoded stages. The control device includes a control circuit Com associated with the circuit Ref for generating the reference voltages applied to the cascoded stage (or cascoded stages) of the selector switch. The constituent elements of the selector switch are the same as those described with reference to FIG. 1. For these reasons, and to simplify the explanation of the invention, the elements common to FIGS. 1 and 3 bear the same references.

In this reference voltage generation circuit, the transistor that gives the reference voltages $Vref_n$, $Vref_p$, at its source and at its drain, respectively, has its gate controlled by the control circuit according to the invention. Thus, according to the level of this high input voltage, the control circuit can make this transistor work as a resistor for high values of the high input voltage or in the off state for the low values of the high input voltage.

The reference voltage generation circuit includes a first P type transistor M12 connected to the node N receiving the high input voltage Ehv and a first intermediate node A. A second P type transistor M13 is connected between the first intermediate node A and a second intermediate node B. A third P type transistor M14 is connected between the second intermediate node B and ground.

The control circuit according to the invention includes a first resistor R1, a diode D1, and a second resistor R2. A gate control voltage for the gate of the second transistor M13 of the reference generation circuit s provided at a point of connection between the diode D1 and one of the resistors, for example resistor R1. The first resistor R1 is connected between the first intermediate node A and the gate of the second transistor M13. The diode D1 and the second resistor P2 are series-connected between the gate of the second transistor M13 and the ground. The control circuit according to the invention makes it possible, for low values of the high input voltage Ehv, to obtain output potentials at the intermediate nodes A and B close to the supply voltages, namely close to Ehv for A and to Gnd for B.

Indeed, for low values of the high input voltage Ehv, the control circuit is in a state of operation such that the transistor M13 is off (i.e., in an open state). These conditions are favorable to the operation of the low voltage selector switch. More specifically, the transistor M13 is kept in the off state so long as its voltage $V_{gate-source}$ is low. This voltage is driven by the diode and the resistors of the control circuit according to the invention, as a function of the potential at the intermediate node A.

The transistor M13 is in the off state chiefly because of the use of the diode D1 at the gate of the transistor M13. Accordingly, the transistor M13 is prevented from coming on so long as the level of the input is below a certain threshold. The resistors R1 and R2 enable the matching of the voltage levels and limit the voltage build up at the drain and source of this transistor.

Figure 4A:
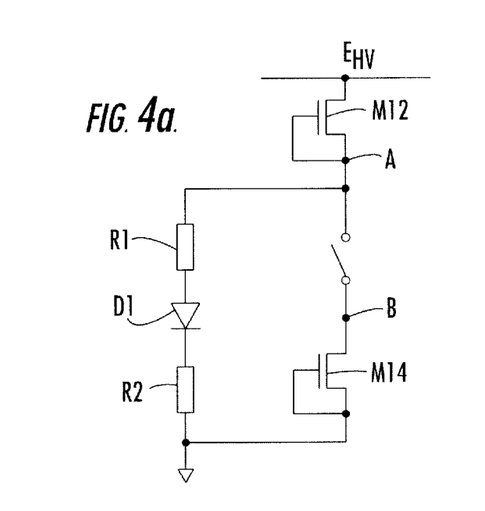
FIGS. 4a and 4b are schematic diagrams showing the two modes of operation of the circuit of FIG. 3.
Figure 4B:
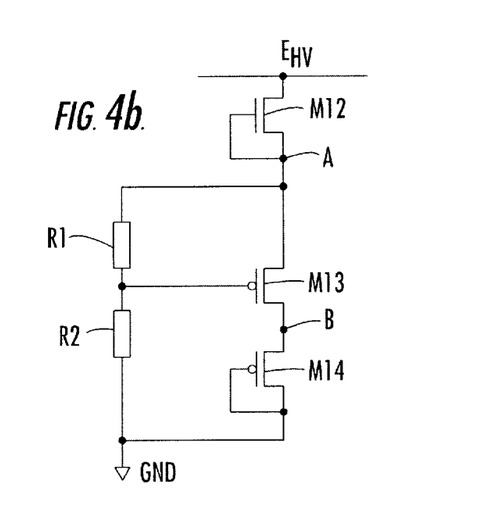

The two modes of operation of the control circuit according to the invention as a function of the high input voltage level Ehv are shown in FIGS. 4a and 4b. When the high input voltage is low, the equivalent diagram of the circuit is that of FIG. 4a. The node B is at a voltage level close to that of the input Ehv because the charge in the transistor M12 is low. The node B is close to the level of Gnd.

When the high input voltage Ehv becomes greater, the equivalent diagram of the control circuit is that of FIG. 4b. The voltage levels at the intermediate nodes A and B are the result of the distribution of the sequence M12, M13 and M14. The resistors R1 and R2 enable the adjusting of the conduction threshold of the diode with respect to the level of the high input voltage Ehv and the setting of the conduction threshold of the transistor M13, and therefore the level of the reference voltage $Vref_p$.

In practice, the resistors are passive elements, typically polysilcon resistors. The diode is a P type MOS transistor M15 whose gate is connected to its drain. To improve the performance characteristics and especially the stability of the reference voltages obtained, the transistor M15 forming the diode and the second transistor M13 may be connected together and biased at the drain potential of the second transistor M13. Thus, a substrate effect is eliminated and the risk of breakdown of the gate oxides of the MOS transistors is reduced.

FIG. 2 shows the new voltage buildup curves 4 and 5 obtained with the control circuit according to the invention. The curve 5 corresponds to the second reference voltage $Vref_p$ and is generally S shaped. When the level of the high input voltage Ehv does not exceed about 2 volts, the reference voltage $Vref_p$ remains substantially zero. Thus, in the low values of the high voltage signal, the voltage difference between the level of the high input voltage Ehv and the reference voltage $Vref_p$ is then sufficient to make the P type transistors of the cascoded stage conductive.

At the high values of the high input voltage, the new voltage reference curve 5($Vref_p$) shows a steeper slope of growth compared to prior art curve noted above. Thus, the difference between this reference voltage and the high input voltage becomes excessive, contrary to what happens in the prior art (curve 3). The P type cascoded transistors are no longer subjected to excessively high voltages. Thus, the emission of hot electrons is limited, and the resistance of the transistors to the number of selection switching operations is improved.

The same advantages are obtained for the N type cascoded transistors biased by the voltage reference $Vref_n$. The new corresponding curve 4 shows an S shape that is less pronounced than that produced by the prior art (curve 2). That is, in the low values of the high input voltage Ehv, the level of $Vref_n$ is close to that of the input Ehv. Then, the level of $Vref_n$ increases at a slower rate with the input Ehv than in the prior art, and the slope of its growth becomes attenuated in the high values of the high input voltage. At these high values, the level of $Vref_n$ tends to approach the curve 5 of the second voltage reference $Vref_p$.

The curve 6 shows the voltage at the gate of the second transistor M13. The size of the diode and the values of the resistors may be adjusted to modify this curve and, therefore, the conduction threshold of the transistor M13 and the final values of the reference voltages $Vref_n$ and $Vref_p$. The control circuit of the invention therefore allows for widening of the window of operation of the selector switch. The elements of the control circuit may be sized as a function of the different constraints on the transistors of the cascoded stage to obtain the optimum curve for each voltage reference, as will be appreciated by those of skill in the art.

The invention has been described with respect to an exemplary CMOS type selector switch (with N and P type transistors) whose cascoded stage also uses N and P type transistors. It can be applied more generally to a MOS transistor selector switch with one or more cascoded stages, for example. It may also be applied where the cascoded stage uses only P MOS transistors or N MOS transistors. In this case, a single voltage reference may be necessary. This reference will be taken at one of the intermediate nodes, namely at the drain or source of the transistor M13.

Figure 5:
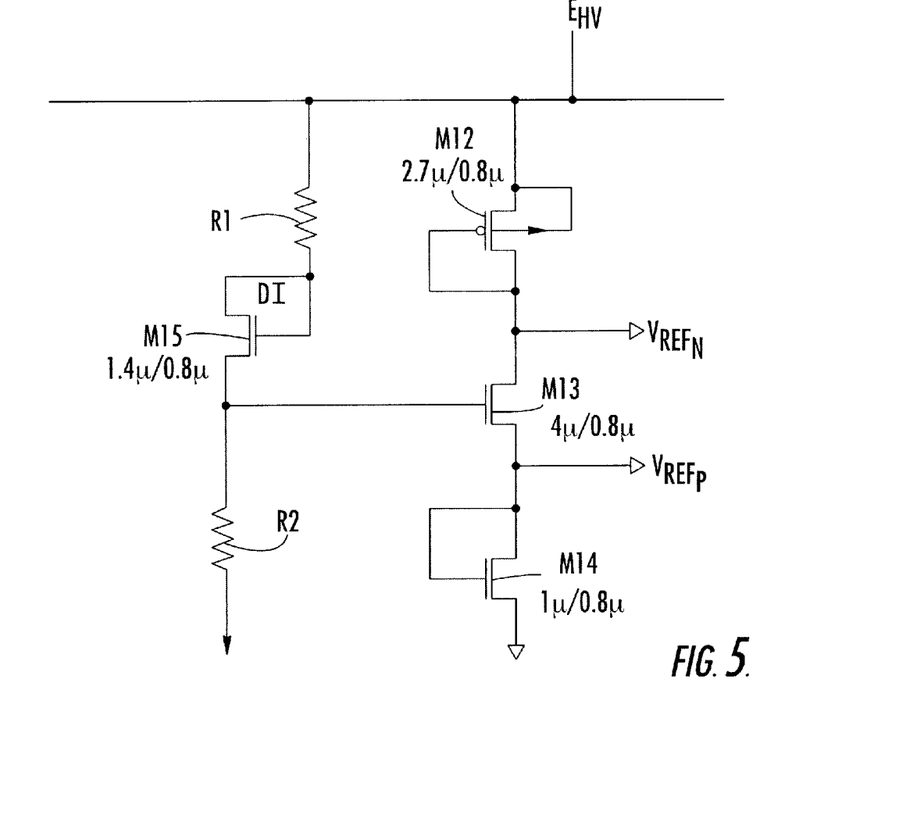
FIG. 5 is a schematic diagram snowing an alternative embodiment of a control circuit according to the invention for a voltage reference circuit using N MOS transistors.

Turning now to FIG. 5, an alternative embodiment of a control circuit according to the inventon is shown using N type MOS transistors for the transistor M13. The transistor M12 may be a PMOS transistor to provide greater voltage characteristics and high resistance against electrostatic discharge. In this case, to provide for the efficient operation of the control circuit, the gate control of the transistor M13 of the reference voltage generation circuit is provided at the connection between the diode D1 and the resistor R2. The resistor R1 and the diode D1 are series-connected between the high input voltage Ehv and the gate of the transistor M13, and the resistor R2 is connected between the gate and the ground Gnd. The MOS transistor forming the diode D1 may be of the same type as the transistor M13, which is an N type transistor, for example. The transistor M14 may be of either the PMOS or NMOS type, whether it is in the circuit of FIG. 5 or in the circuit of FIG. 3.

The control device according to the invention is a low cost device compared with that of the prior art. It requires only two resistors, which are passive elements, and one transistor for the diode. Furthermore, the control device according to the invention is capable of controlling several selector switches at the same time. In other words, the reference voltage or voltages given by the generation circuit Ref and its control circuit Com may be applied to several selector switches. This is particularly advantageous in an application for the switching of a programming voltage over to one of the memory elements.

Figure 6:
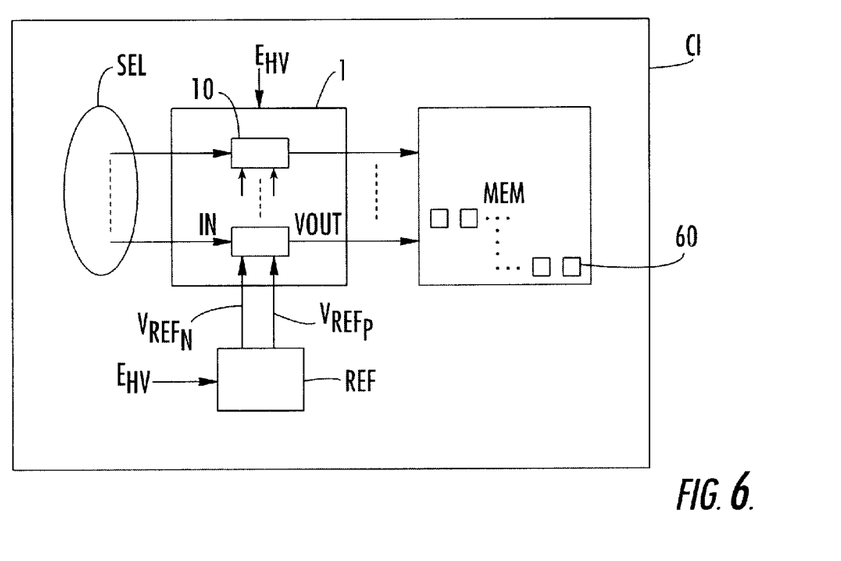
FIG. 6 is a schematic diagram showing an exemplary application of a control device according to the invention.

An exemplary application is shown schematically in FIG. 6. In this example, an integrated circuit CI comprises an electrically programmable non-volatile memory MEM. A circuit 1 of high voltage selector switches 10 is provided to apply a programming voltage to elements 60 of the memory. The circuit 1 receives logic signals (Sel) at respective memory element selection inputs. Each logic signal is applied as a control input IN of a selector switch of the circuit 1 to apply the high voltage to elements of the selected memory. In the example, a control device according to the invention is provided to give the reference voltages $Vref_p$ and $Vref_n$ to each of the selector switches 10.

The invention may also be applied to the programming of memory elements of an EPROM, EEPROM or other type of memory organized in matrix form. Furthermore, the invention may be used for the programming of discrete memory elements distributed in internal circuits (e.g., in redundancy circuits), such as electrically programmable fuses.

That which is claimed is:

1. A control device for controlling a selector switch coupled to a changing high input voltage and comprising at least one cascoded stage including a plurality of MOS transistors, the control device comprising:
   a reference voltage generating circuit for providing bias voltages to the plurality of MOS transistors, the reference voltage generating circuit being coupled to the changing high input voltage and comprising a first MOS transistor having a source, a drain, and a gate, the MOS transistor providing a first reference voltage at the drain and a second reference voltage at the source; and
   a circuit for controlling the gate of the first MOS transistor based upon the changing high input voltage comprising a first resistor, a diode, and a second resistor connected in series, the circuit providing a gate control voltage for setting the first MOS transistor in a conductive state or a non-conductive state depending upon a level of the changing high input voltage.

2. The control device of claim 1 wherein the gate control voltage is provided between the diode and the first resistor.

3. The control device of claim 1 wherein the gate control voltage is provided between the diode and the second resistor.

4. The control device of claim 1 wherein the reference voltage generating circuit further comprises:
   a second MOS transistor connected between the changing high input voltage and the first MOS transistor, the second MOS transistor having a gate and a drain connected together; and
   a third MOS.transistor connected between the first MOS transistor and a voltage reference, the third MOS transistor having a gate and a drain connected together.

5. The control device of claim 4 wherein the second MOS transistor comprises a P type MOS transistor.

6. The control device of claim 1 wherein the first MOS transistor comprises a first P type MOS transistor; and wherein the first resistor is connected between the source and the gate of the first P type MOS transistor, and the diode and the second resistor are connected between the gate of the first P type MOS transistor and a voltage reference.

7. The control device of claim 1 wherein the first MOS transistor comprises a first N type MOS transistor; and wherein the first resistor and the diode are connected between the changing high input voltage and the gate of the first N type MOS transistor, and the second resistor is connected between the gate of the first N type MOS transistor and a voltage reference.

8. The control device of claim 1 wherein the first and second resistors are passive elements.

9. The control device of claim 1 wherein the diode comprises a P type MOS transistor having a gate and a drain connected together.

10. The control device according to claim 1 wherein the diode comprises an N type MOS transistor having a gate and a drain connected together.

11. A control device for controlling a selector switch coupled to a changing high input voltage and comprising at least one cascoded stage including a plurality of transistors, the control device comprising:
    a reference voltage generating circuit for providing bias voltages to the plurality of transistors, the reference voltage generating circuit being coupled to the changing high input voltage and comprising a first transistor having a first conduction terminal, a second conduction terminal, and a control terminal, the first transistor providing a first reference voltage at the first conduction terminal and a second reference voltage at the second conduction terminal; and
    a circuit for controlling the control terminal of the first transistor based upon the changing high input voltage by providing a gate control voltage for setting the first transistor in a conductive state or a non-conductive state depending upon a level of the changing high input voltage.

12. The control device of claim 11 wherein the circuit for controlling comprises a first resistor, a diode, and a second resistor connected in series; and wherein the gate control voltage is provided to the gate of the first transistor between the diode and the first resistor.

13. The control device of claim 11 wherein the circuit for controlling comprises a first resistor, a diode, and a second resistor connected in series; and wherein the gate control voltage is provided to the gate of the first transistor between the diode and the second resistor.

14. The control device of claim 11 wherein the first transistor comprises a first MOS transistor; and wherein the reference voltage generating circuit further comprises:
    a second MOS transistor connected between the changing high input voltage and the first MOS transistor, the second MOS transistor having a gate and a drain connected together; and
    a third MOS transistor connected between the first MOS transistor and a voltage reference, the third MOS transistor having a gate and a drain connected together.

15. The control device of claim 14 wherein the second MOS transistor comprises a P type MOS transistor.

16. The control device of claim 11 wherein the first transistor comprises a first MOS transistor, the first conduction terminal comprises a drain, the second conduction terminal comprises a source, and the control terminal comprises a gate.

17. The control device of claim 16 wherein the first MOS transistor comprises a first P type MOS transistor; and wherein the first resistor is connected between the source and the gate of the first P type MOS transistor, and the diode and the second resistor are connected between the gate of the first P type MOS transistor and a voltage reference.

18. The control device of claim 16 wherein the first MOS transistor comprises a first N type MOS transistor; and wherein the first resistor and the diode are connected between the changing high input voltage and the gate of the first N type MOS transistor, and the second resistor is connected between the gate of the first N type MOS transistor and a voltage reference.

19. The control device of claim 11 wherein the diode comprises a P type MOS transistor having a gate and a drain connected together.

20. The control device of claim 11 wherein the diode comprises an N type MOS transistor having a gate and a drain connected together.

21. An integrated circuit comprising:
    a plurality of electrically programmable non-volatile memory elements;

a selector switch for programming the plurality of electrically programmable non-volatile memory elements; and at least one control device for controlling the selector switch coupled to a high input voltage and comprising at least one cascoded stage including a plurality of MOS transistors, the at least one control device comprising a reference voltage generating circuit for providing bias voltages to the plurality of MOS transistors, the reference voltage generating circuit being coupled to the high input voltage and comprising a first MOS transistor having a source, a drain, and a gate, the first MCS transistor providing a first reference voltage at the drain and a second reference voltage at the source, and a circuit for controlling the gate of the first MOS transistor based upon the high input voltage comprising a first resistor, a diode, and a second resistor connected in series, the circuit providing a gate control voltage for setting the MOS transistor in a conductive state or a non-conductive state depending upon a level of the high input voltage.

22. The integrated circuit of claim 21 wherein the gate control voltage is provided between the diode and the first resistor.

23. The integrated circuit of claim 21 wherein the gate control voltage is provided between the diode and the second resistor.

24. The integrated circuit of claim 21 wherein the reference voltage generating circuit further comprises:

a second MOS transistor connected between the high input voltage and the first MOS transistor, the second MOS transistor having a gate and a drain connected together; and a third MOS transistor connected between the first MOS transistor and a voltage reference, the third transistor having a gate and a drain connected together.

25. The integrated circuit of claim 24 wherein the second MOS transistor comprises a P type MOS transistor.

26. The integrated circuit of claim 21 wherein the first MOS transistor comprises a first P type MOS transistor; and wherein the first resistor is connected between the source and the gate of the first P type MOS transistor, and the diode and the second resistor are connected between the gate of the first P type MOS transistor and a voltage reference.

27. The integrated circuit of claim 21 wherein the first MOS transistor comprises a first N type MOS transistor; and wherein the first resistor and the diode are connected between the high input voltage and the gate of the first N type MOS transistor, and the second resistor is connected between the gate of the first N type MOS transistor and a voltage reference.

28. The integrated circuit of claim 21 wherein the first and second resistors are passive elements.

29. The integrated circuit of claim 21 wherein the diode comprises a P type MOS transistor having a gate and a drain connected together.

30. The integrated circuit according to claim 21 wherein the diode comprises an N type MOS transistor having a gate and a drain connected together.

* * * * *

UNITED STATES PATENT AND TRADEMARK OFFICE
CERTIFICATE OF CORRECTION

PATENT NO. : 6,563,372 B1  Page 1 of 1
DATED : May 13, 2003
INVENTOR(S) : Richard Fournel It is certified that error appears in the above-identified patent and that said Letters Patent is hereby corrected as shown below:

Title page,
Item [57], ABSTRACT,
Line 2, delete "inout" insert -- input --

Column 2,
Line 59, delete "med-point" insert -- mid-point --
Line 66, delete "P Hype" insert -- P type --

Column 3,
Line 2, delete "At" insert -- it --
Lines 37 and 51, delete "swatch" insert -- switch --

Column 4,
Line 62, delete "s" insert -- is --

Column 7,
Line 42, delete "MOS." insert -- MOS --

Column 9,
Line 14, delete "MCS" insert -- MOS --

Signed and Sealed this

Seventh Day of October, 2003

JAMES E. ROGAN
*Director of the United States Patent and Trademark Office*